(12) United States Patent
Li

(10) Patent No.: US 10,978,867 B2
(45) Date of Patent: Apr. 13, 2021

(54) BATTERY PROTECTION SYSTEMS

(71) Applicant: O2Micro, Inc., Santa Clara, CA (US)

(72) Inventor: Guoxing Li, Sunnyvale, CA (US)

(73) Assignee: 02Micro Inc., Santa Clara, CA (US)

( * ) Notice: Subject to any disclaimer, the term of this patent is extended or adjusted under 35 U.S.C. 154(b) by 198 days.

(21) Appl. No.: 16/365,395

(22) Filed: Mar. 26, 2019

(65) Prior Publication Data

US 2019/0326746 A1    Oct. 24, 2019

(30) Foreign Application Priority Data

Apr. 19, 2018    (GB) ..................................... 1806415

(51) Int. Cl.
| | | |
|---|---|---|
| *G01R 31/3835* | (2019.01) | |
| *H02H 7/18* | (2006.01) | |
| *G01R 31/364* | (2019.01) | |
| *H01M 10/48* | (2006.01) | |
| *G01R 31/36* | (2020.01) | |
| *H01M 10/42* | (2006.01) | |

(52) U.S. Cl.
CPC ............. *H02H 7/18* (2013.01); *G01R 31/364* (2019.01); *G01R 31/3835* (2019.01); *H01M 10/482* (2013.01); *G01R 31/36* (2013.01); *G01R 31/3646* (2019.01); *H01M 10/425* (2013.01); *H01M 10/48* (2013.01)

(58) Field of Classification Search
USPC .............................. 361/86–89; 320/118, 162
See application file for complete search history.

(56) References Cited

U.S. PATENT DOCUMENTS

| | | | |
|---|---|---|---|
| 8,219,333 B2 | 7/2012 | Li | |
| 8,450,976 B2 | 5/2013 | Lipcsei et al. | |
| 2001/0026147 A1 | 10/2001 | Nakashimo | |
| 2008/0164881 A1 | 7/2008 | Miyamoto | |
| 2008/0316665 A1 | 12/2008 | Masiuk | |
| 2010/0141219 A1 | 6/2010 | Li | |
| 2010/0264881 A1 | 10/2010 | Yin et al. | |
| 2012/0280572 A1 | 11/2012 | Li et al. | |

(Continued)

FOREIGN PATENT DOCUMENTS

| | | |
|---|---|---|
| CN | 102315663 A | 1/2012 |
| CN | 102457086 A | 5/2012 |

(Continued)

*Primary Examiner* — Danny Nguyen

(57) ABSTRACT

A system includes multiple protection modules. Each protection module includes monitoring terminals that monitor battery cells' status, an output terminal that outputs a protection signal if an abnormal condition in the cells is detected, a switching terminal that receives a switching signal, and detection circuitry that switches from a normal-working mode to a fast-test mode if receiving the switching signal, delays outputting the protection signal for a first time interval if the abnormal condition is detected in the normal-working mode, and delays outputting the protection signal for a second time interval, less than the first time interval, if the abnormal condition is detected in the fast-test mode. In the protection modules, the switching terminal of a first protection module and a monitoring terminal of the first protection module are coupled to a second protection module and receive a protection signal from the output terminal of the second protection module.

20 Claims, 7 Drawing Sheets

(56) References Cited

U.S. PATENT DOCUMENTS

2013/0119936 A1*  5/2013  Emori .................... B60L 58/14
                                                   320/118
2013/0163134 A1   6/2013  Ji
2017/0269163 A1   9/2017  Yang et al.
2019/0044198 A1*  2/2019  Kuroda .................. H01M 2/34

FOREIGN PATENT DOCUMENTS

| CN | 203522160 U | 4/2014 |
| CN | 205070405 U | 3/2016 |
| CN | 205724851 U | 11/2016 |
| CN | 206452101 U | 8/2017 |
| CN | 107202958 A | 9/2017 |
| JP | 2005012852 A | 1/2005 |

* cited by examiner

BATTERY PROTECTION SYSTEMS

RELATED APPLICATION

This application claims benefit under 35 U.S.C. § 119(a) to Application No. GB1806415.4, filed with the United Kingdom Intellectual Property Office on Apr. 19, 2018, hereby incorporated herein by reference in its entirety.

BACKGROUND

FIG. 1 illustrates a circuit diagram of a conventional battery protection system 100. As shown in FIG. 1, the protection system 100 includes a primary protection module 108 and a secondary protection module 102. The primary protection module 108 protects the battery cells 104 from an over- or under-voltage condition, over-current condition, short circuit condition, and over- or under-temperature condition. If the primary protection module 108 does not function, e.g., it breaks down, then the secondary protection module 102 provides backup protection to the battery cells 104. For example, when the battery cells 104 are charged by a charger (not shown) that is coupled to the terminals PACK+ and PACK−, if the secondary protection module 102 detects an abnormal condition in the battery cells 104, then the protection module 102 generates a protection signal 110 to turn on the switch MN1 to burn the fuse 106 such that the battery cells 104 are disconnected from the charger. Additionally, in order to avoid a false indication of an abnormal condition, when the protection module 102 detects a sign of an abnormal condition in the battery cells 104, the protection module 102 delays outputting the protection signal 110 for a preset time interval ΔT1 (e.g., one, two, or four seconds). If the protection module 102 determines that the abnormal status lasts for the preset time interval ΔT1, then the protection module 102 confirms that an abnormal condition has occurred in the battery cells 104.

The protection system 100 is used to protect a battery pack that includes a small number, e.g., five, of battery cells. In order to protect a battery pack that includes more than five battery cells, two or more of the secondary protection modules 102 are used.

FIG. 2A illustrates a circuit diagram of a conventional battery protection system 200A that includes secondary protection modules 202 and 212. As shown in FIG. 2A, the protection module 202 (hereinafter, the low-side module) monitors the battery cells 204, and the protection module 212 (hereinafter, the high-side module) monitors the battery cells 214. If a sign of an abnormal condition in the battery cells 204 is detected, then the low-side module 202 starts to count time. After a preset time interval ΔT1 (e.g., one, two, or four seconds), if the low-side module 202 confirms that an abnormal condition is present in the battery cells 204, then the low-side module 202 outputs a protection signal 210 to burn the fuse 206. Similarly, if a sign of an abnormal condition in the other set of battery cells 214 is detected, then the high-side module 212 outputs a protection signal 216 after the preset time interval ΔT1. As shown in FIG. 2A, the low-side module 202 receives, at its monitoring terminal BAT5, the protection signal 216 from the high-side module 212, and generates the protection signal 210 to burn the fuse 206 in response to the protection signal 216. Thus, the battery protection system 200A can protect both sets of the battery cells 204 and 214 from an abnormal condition.

However, when the low-side module 202 receives the protection signal 216 from the high-side module 212, the low-side module 202 also delays outputting the protection signal 210 for the preset time interval ΔT1. Thus, there is a time delay ΔT2 that is twice the preset time interval ΔT1 (ΔT2=2*ΔT1) from the detection of an abnormal condition in the battery cells 214 until the protection signal 210 is output. The time delay ΔT2 may be too long, and consequently the protection system 200A may not be able to protect the battery cells 214 in time.

FIG. 2B illustrates a circuit diagram of another conventional battery protection system 200B. The battery protection system 200B is similar to the battery protection system 200A except that in the battery protection system 200B, the protection signal 216 from the high-side module 212 is output to control a switch MN2, instead of being output to the low-side module 202. Thus, if an abnormal condition in the battery cells 214 is detected, then the high-side module 212 outputs a protection signal 216 to turn on the switch MN2 to burn the fuse 206. The high-side module 212 delays outputting the protection signal 216 for a preset time interval ΔT1. Additionally, the battery protection system 200B includes resistors R1, R2, R4, R5, R6, and switches MN1 and MP1, and these elements constitute a level shifter. More specifically, if an abnormal condition in the battery cells 204 is detected, then the low-side module 202 outputs a protection signal 210. The level shifter shifts a voltage level of the protection signal 210 to a higher voltage level to turn on the switch MN2 to burn the fuse 206. For example, the protection signal 210 turns on the switch MN1 to pull down a gate voltage of the switch MP1. Accordingly, the switch MP1 is turned on to pull up a gate voltage of the switch MN2. Thus, the switch MN2 is turned on to burn the fuse 206. The low-side module 202 also delays outputting the protection signal 210 for the preset time interval ΔT1. Thus, compared with the battery protection system 200A in FIG. 2A, the battery protection system 200B may better protect the battery cells 214.

However, because the level shifter includes the resistors R1, R2, R4, R5, R6, and the switches MN1 and MP1, the cost, size, and power consumption of the PCB (printed circuit board) for the protection system 200B are increased.

Thus, a battery protection system that addresses the abovementioned shortcomings would be beneficial.

SUMMARY

In an embodiment, a battery protection system includes multiple protection modules. Each protection module includes a set of monitoring terminals, an output terminal, a switching terminal, and detection circuitry coupled to the monitoring terminals, the output terminal, and the switching terminal. The monitoring terminals are operable for monitoring a status of a set of battery cells. The output terminal is operable for outputting a protection signal if an abnormal condition in the battery cells is detected. The switching terminal is operable for receiving a switching signal. In response to the switching signal, the detection circuitry switches from a normal-working mode to a fast-test mode. If an abnormal condition is detected in the normal-working mode, then the detection circuitry delays outputting the protection signal for a first time interval. If the abnormal condition is detected in the fast-test mode, then the detection circuitry delays outputting the protection signal for a second time interval that is less than the first time interval. The protection modules include a first protection module and a second protection module. The switching terminal of the first protection module and a monitoring terminal of the first protection module are coupled to the second protection module and are operable for receiving a protection signal from the output terminal of the second protection module.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
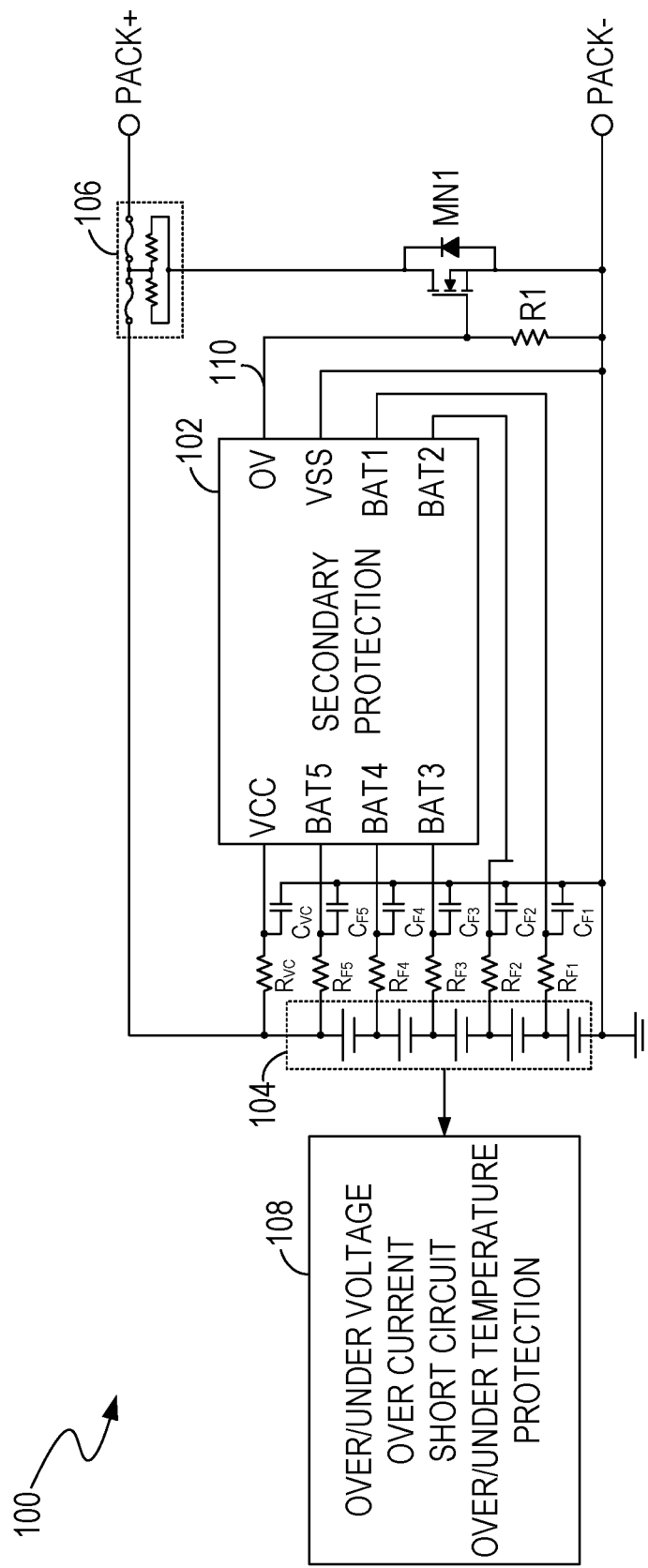
FIG. 1 illustrates a circuit diagram of a conventional battery protection system.
Figure 2A:
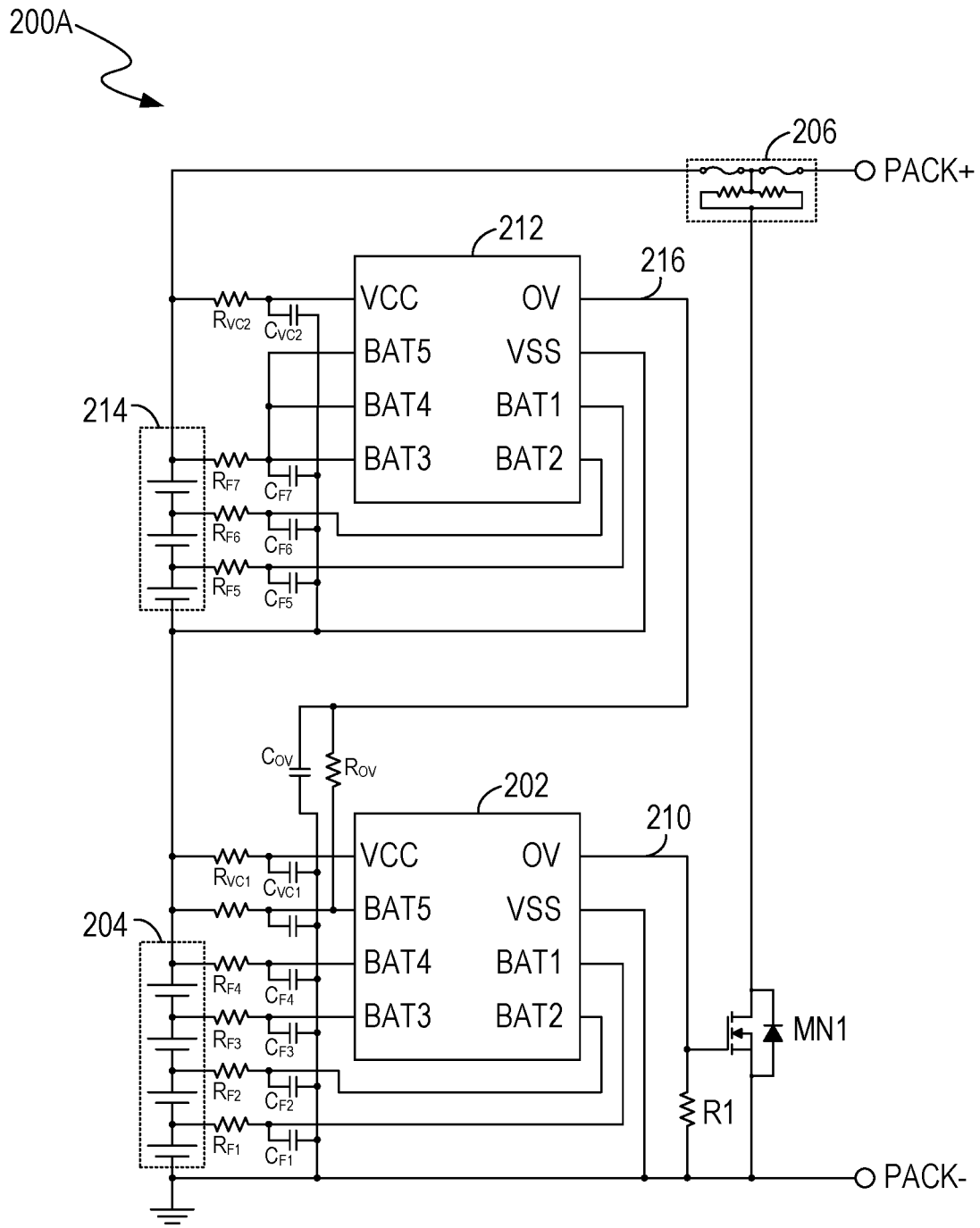
FIG. 2A illustrates a circuit diagram of a conventional battery protection system.
Figure 2B:
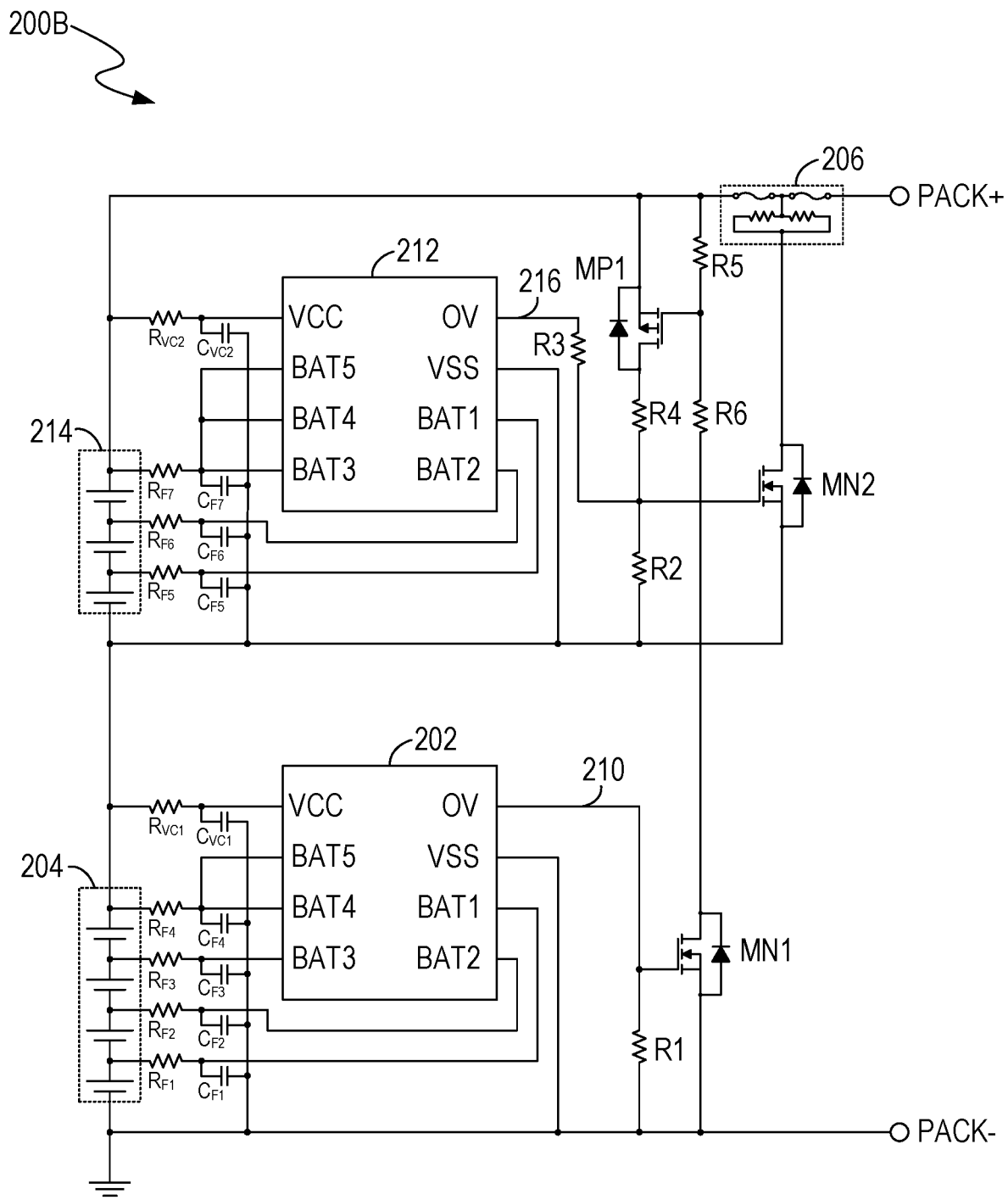
FIG. 2B illustrates a circuit diagram of a conventional battery protection system.

An embodiment according to the present invention provides a battery protection system that includes multiple protection modules for protecting multiple sets of battery cells. The protection module can selectively operate in a normal-working mode or a fast-test mode. If an abnormal condition in the battery cells is detected in the normal-working mode, then the protection module can output a protection signal after a first time interval $\Delta TN$ (such as, but not limited to, one, two, or four seconds); or if the abnormal condition is detected in the fast-test mode, then the protection module can output the protection signal after a second time interval $\Delta TF$ that is less than the first time interval $\Delta TN$. In an embodiment, a first protection module can generate a first protection signal to protect a first set of battery cells, and/or receive a second protection signal from a second protection module to generate the first protection signal to protect a second set of battery cells. Additionally, the second protection signal can control the first protection module to operate in the fast-test mode. As a result, the delay from the detection of an abnormal condition in the second set of battery cells to the output of the first protection signal is approximately equal to the sum of the first and second time intervals, e.g., $\Delta TN + \Delta TF$. In an embodiment, the second time interval $\Delta TF$ is relatively short (such as, but not limited to, sixteen or thirty-two milliseconds), and therefore the time delay $\Delta TN + \Delta TF$ is relatively short compared with the time delay $\Delta T2$ for the conventional battery protection system 200A of FIG. 2A. Furthermore, the level shifter in the conventional battery protection system 200B of FIG. 2B is omitted, and therefore the battery protection system in embodiments according to the present invention have a smaller PCB size, lower cost, and consume less power.

Figure 3:
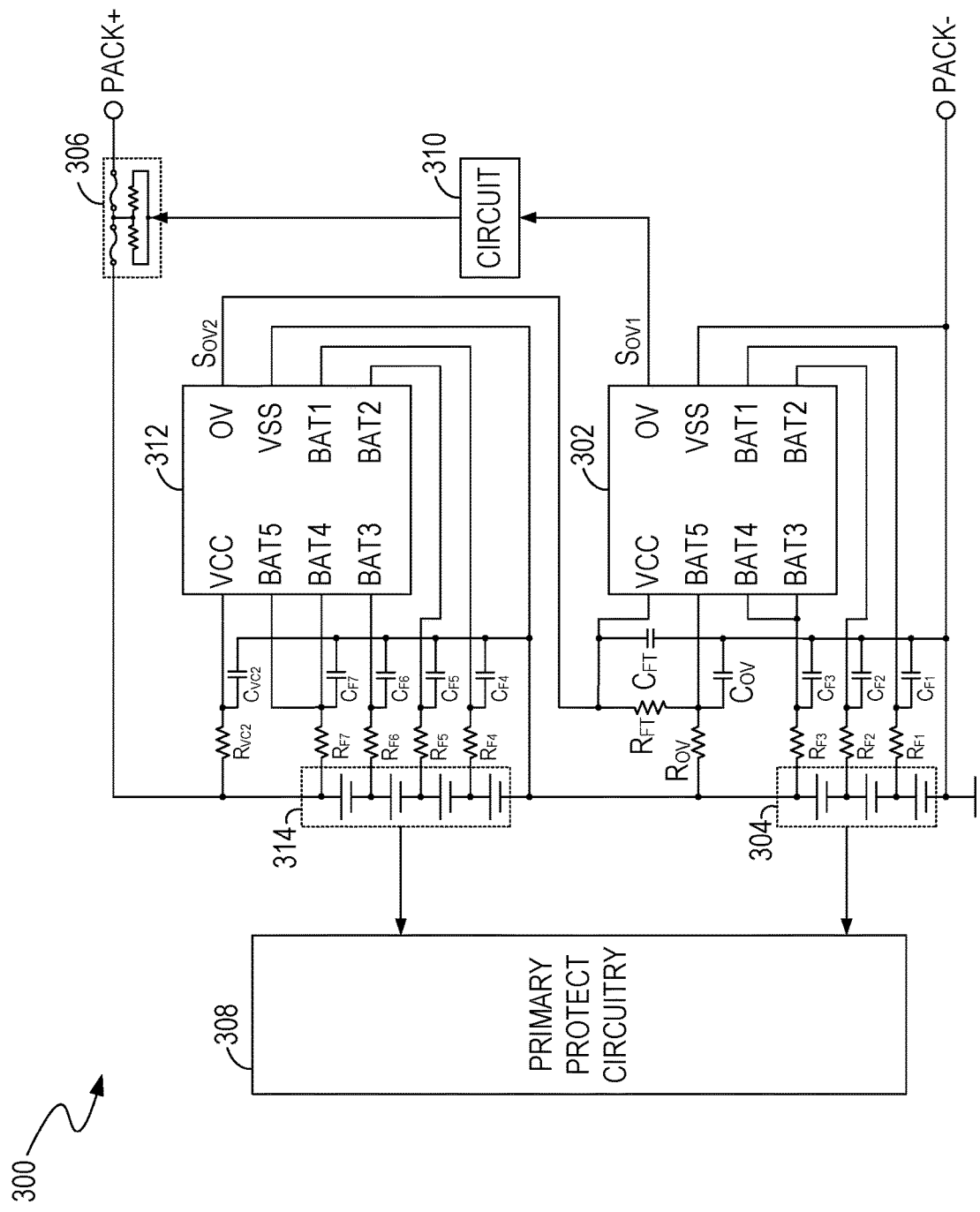
FIG. 3 illustrates a circuit diagram of an example of a battery protection system, in an embodiment of the present invention.

FIG. 3 illustrates a circuit diagram of an example of a battery protection system in a battery pack 300, in an embodiment of the present invention. As shown in FIG. 3, the battery pack 300 includes a first set of battery cells 304 and a second set of battery cells 314. The battery protection system includes a primary protection circuitry 308, secondary protection modules 302 and 312, and a fuse 306. The primary protection circuitry 308 can protect the battery cells 304 and 314 from, e.g., an over-voltage condition, under-voltage condition, over-current condition, short circuit condition, over-temperature condition, and/or under-temperature condition. If the protection circuitry 308 does not function or breaks down, then the secondary protection modules 302 and 312 can provide backup protection to the battery cells 304 and 314 by controlling, e.g., burning (blowing), the fuse 306.

In an embodiment, the protection modules 302 and 312 have similar circuit structures and functions. For example, each of the protection modules 302 and 312 can include a set of monitoring terminals (e.g., labeled "BAT1," "BAT2," . . . , "BAT5") operable for monitoring a status of a set of battery cells (e.g., 304 or 314), an output terminal (e.g., labeled "OV") operable for outputting a protection signal (e.g., $S_{OV1}$ or $S_{OV2}$) if an abnormal condition (e.g., an over-voltage condition) in the battery cells is detected, and a switching terminal (e.g., labeled "VCC") operable for receiving a switching signal. In an embodiment, the switching terminal VCC can also be used as a power input terminal that receives power supply to operate the protection module. Additionally, in an embodiment, each protection module 302/312 includes detection circuitry coupled to the above-mentioned terminals. The detection circuitry can determine whether an abnormal condition (e.g., an over-voltage condition) is present according to information received at the monitoring terminals. In response to detecting an abnormal condition, the detection circuitry can generate the protection signal after a predetermined time delay. The detection circuitry can also switch from a normal-working mode to a fast-test mode in response to the switching signal.

More specifically, in an embodiment, to avoid a false indication of an abnormal condition, when the protection module 302 or 312 detects a sign of an abnormal condition in the battery cells, the protection module does not output a protection signal immediately. Instead, the protection module waits for a time interval $\Delta TN$ (e.g., one, two, or four seconds). When the time interval $\Delta TN$ expires, if the protection module still detects the sign of an abnormal condition, then the protection module confirms that the abnormal condition is present, and generates the protection signal.

In an embodiment, when a protection module (e.g., 302 or 312) is manufactured and packaged into an IC (integrated circuit) package, a series of tests are performed on the protection module to make sure that the protection module works properly. The series of tests are performed in a fast-test mode, in which the time delay $\Delta TF$ before outputting the protection signal is relatively short (e.g., sixteen or thirty-two milliseconds).

In an embodiment, a voltage signal (hereinafter, a switching signal) at the switching terminal VCC can control the protection module to selectively operate in a normal-working mode or a fast-test mode. For example, if a voltage level of the switching signal is in a normal operating voltage range of the protection module (e.g., the protection module receives a supply voltage that is in the normal operation voltage range), then the protection module operates in the normal-working mode. If the abnormal condition of the battery cells is detected in the normal-working mode, then the detection circuitry delays outputting the protection signal for a first time interval ΔTN (e.g., one, two, or four seconds). If the switching signal is higher than a preset voltage level, e.g., VBAT5+5V, then the protection module operates in the fast-test mode. "VBAT5" represents a voltage level at the monitoring terminal BAT5. If the abnormal condition of the battery cells is detected in the fast-test mode, then the detection circuitry delays the outputting of the protection signal for a second time interval ΔTF (e.g., sixteen or thirty-two milliseconds) that is less than the first time interval ΔTN.

In the example of FIG. 3, the protection module 302 (hereinafter, the first protection module) monitors a status of a first set of battery cells 304 via its monitoring terminals BAT1-BAT3, and the protection module 312 (hereinafter, the second protection module) monitors a status of a second set of battery cells 314 via its monitoring terminals BAT1-BAT4. Additionally, the switching terminal VCC of the first protection module 302 and a first monitoring terminal BAT5 of the first protection module 302 are coupled to the second protection module 312 and operable for receiving the protection signal $S_{OV2}$ from the output terminal OV of the second protection module 312. In the example of FIG. 3, the first monitoring terminal BAT5 of the first protection module 302 is coupled to the second protection module 312 via a resistor $R_{FT}$, and receives the signal from the output terminal OV of the second protection module 312 via the resistor $R_{FT}$. If an abnormal condition in the first set of battery cells 304 is detected, then the first protection module 302 outputs, at its output terminal OV, a first protection signal $S_{OV1}$ with a delay of a first time interval ΔTN (e.g., one, two, or four seconds). The first protection signal $S_{OV1}$ can control a circuit 310 (e.g., including a switch coupled between the fuse 306 and ground) to control (e.g., burn) the fuse 306. If an abnormal condition in the second set of battery cells 314 is detected, then the second protection module 312 outputs a second protection signal $S_{OV2}$, with a delay of the first time interval ΔTN, to the first monitoring terminal BAT5 of the first protection module 302. In response to the second protection signal $S_{OV2}$, the first protection module 302 also outputs, at its output terminal OV, a first protection signal $S_{OV1}$ to burn the fuse 306. Thus, the battery protection system in embodiments according to the present invention can protect multiple sets of battery cells using multiple protection modules. Moreover, the switching terminal VCC of the first protection module 302 can also receive the second protection signal $S_{OV2}$ from the output terminal OV of the second protection module 312. In response to the second protection signal $S_{OV2}$, the detection circuitry of the first protection module 302 can switch from the normal-working mode to the fast-test mode. The delay in outputting the protection signal $S_{OV1}$ in the fast-test mode can be set to a second time interval ΔTF (e.g., sixteen or thirty-two milliseconds) that is less (e.g., much less) than the first time interval ΔTN (e.g., one, two, or four seconds). Thus, the delay ΔTN+ΔTF from the detection of an abnormal condition in the second set of battery cells 314 to outputting of the first protection signal $S_{OV1}$ is shorter (e.g., much shorter) than the time delay ΔT2 (e.g., 2*ΔT1) for the conventional battery protection system 200A (FIG. 2A).

Figure 4:
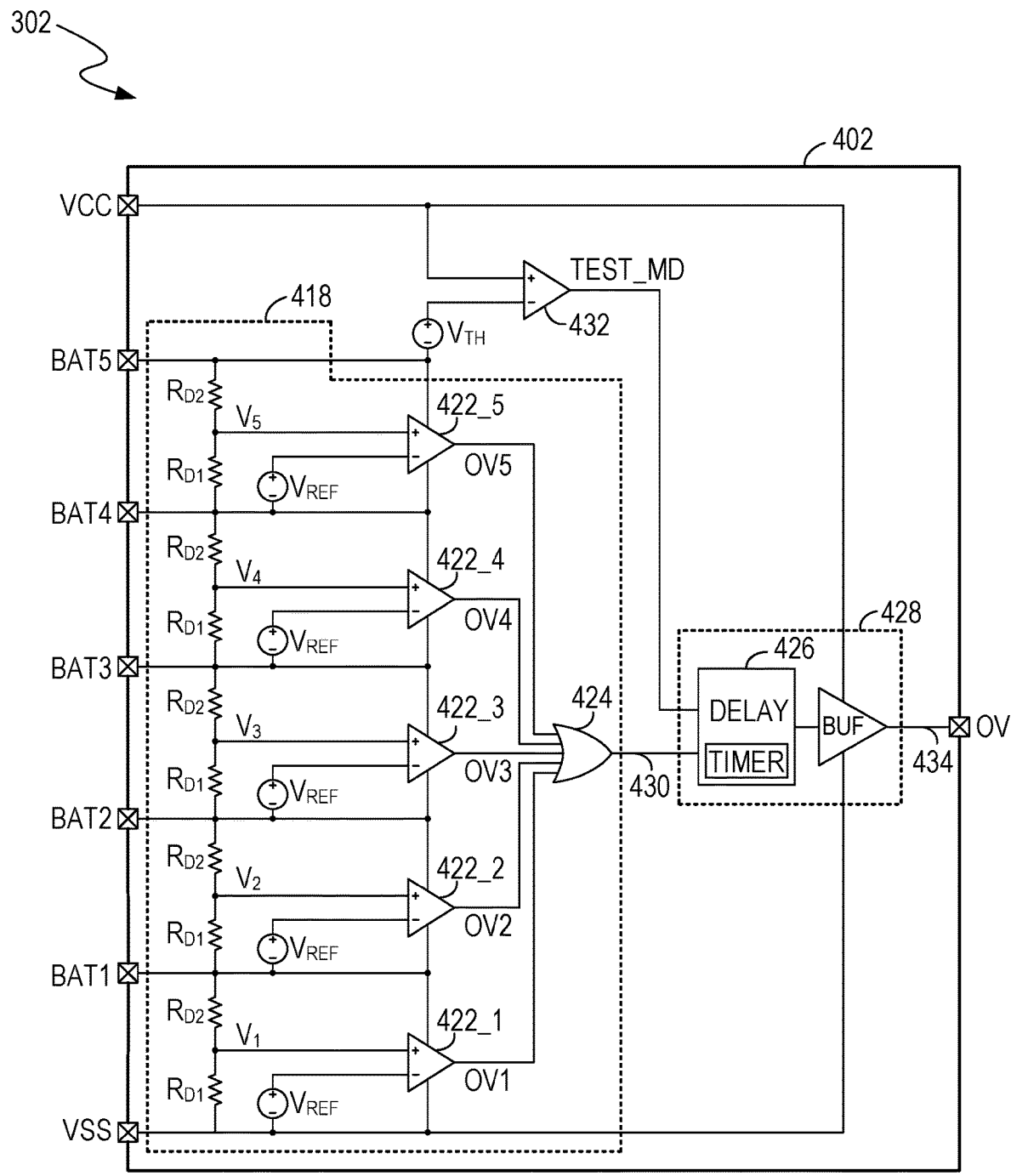
FIG. 4 illustrates a schematic diagram of an example of detection circuitry, in an embodiment of the present invention.

FIG. 4 illustrates a schematic diagram of an example of detection circuitry 402 in the first protection module 302, in an embodiment of the present invention. In an embodiment, the second protection module 312 has a circuit structure similar to that of the first protection module 302. FIG. 4 is described in combination with FIG. 3. As shown in FIG. 4, the detection circuitry 402 includes a monitoring circuit 418 coupled to the monitoring terminals BAT1-BAT5, a delay circuit 428 coupled to the monitoring circuit 418, and a fast-test detection circuit 432 coupled to the delay circuit 428.

In an embodiment, the monitoring circuit 418 monitors status of a set of cell voltages and generates an indication signal 430 if a cell voltage of the cell voltages is greater than a reference voltage $V_{REF}*(R_{D1}+R_{D2})/R_{D1}$. For example, the monitoring circuit 418 can include a set of comparators 422_1, 422_2, . . . , 422_5. Each of the comparators can compare a corresponding signal, e.g., $V_1, V_2, \ldots,$ or $V_5$, indicative of a voltage difference VD's between two adjacent terminals of the monitoring terminals VSS, BAT1, BAT2, . . . , BAT5, with a reference voltage $V_{REF}$. If the corresponding signal, e.g., $V_1, V_2, \ldots,$ or $V_5$, is greater than the reference voltage $V_{REF}$, e.g., indicating that the corresponding voltage difference VD's is greater than the reference voltage $V_{REF}*(R_{D1}+R_{D2})/R_{D1}$, then the comparator outputs a corresponding signal OV1, OV2, or OV5 to an OR gate 424. Thus, the OR gate 424 outputs an indication signal 430.

In the example of the first protection module 302 in FIG. 3, a voltage difference between the terminals VSS and BAT1, a voltage difference between the terminals BAT1 and BAT2, and a voltage difference between the terminals BAT2 and BAT3 are respectively indicative of cell voltages of the first set of battery cells 304. In addition, a voltage signal at the first monitoring terminal BAT5 is controlled according to a status of the cell voltages of the second set of battery cells 314, and therefore a voltage difference between the terminals BAT4 and BAT5 is indicative of the status of cell voltages of the battery cells 314. As a result, the cell voltages monitored by the monitoring circuit 418 can include the cell voltages of the first set of battery cells 304 and the cell voltages of the second set of battery cells 314.

As mentioned above, in an embodiment, a voltage signal at the first monitoring terminal BAT5 of the first protection module 302 is controlled according to a status of the cell voltages of the second set of battery cells 314. More specifically, with reference to FIG. 3 for example, the output terminal OV of the second protection module 312 (hereinafter, the second output terminal OV) is coupled to the first set of battery cells 304 via resistors $R_{FT}$ and $R_{OV}$, and the first monitoring terminal BAT5 of the first protection module 302 is coupled to a connection node of the resistors $R_{FT}$ and $R_{OV}$. Thus, a voltage drop across the resistor $R_{OV}$, e.g., representing a voltage difference between the terminals BAT5 and BAT4 of the first protection module 302, is controlled by a voltage at the second output terminal OV.

In an embodiment, a second protection signal $S_{OV2}$ at the second output terminal OV can be high enough to cause the voltage drop across the resistor $R_{OV}$ to be greater than the reference voltage $V_{REF}*(R_{D1}+R_{D2})/R_{D1}$. Thus, if an abnormal condition is present in the second set of battery cells 314, then the first protection module 302 can detect the abnormal condition via the first monitoring terminal BAT5 of the first protection module 302.

Returning to FIG. 4, in an embodiment, the delay circuit 428 starts to count time in response to the indication signal 430, and generates a first protection signal 434 with a predetermined time delay ΔT. In an embodiment, the delay circuit 428 includes a timer 426. The timer 426 can include any kind of circuit or device that is capable of counting time. By way of example, the timer 426 may include a capacitor controlled by a preset current. In response to the indication signal 430, the preset current starts charging (or discharging) the capacitor such that a voltage of the capacitor changes. When the voltage change of the capacitor reaches a specified amount, then the timer 426 generates a signal to a buffer and the buffer outputs the protection signal 434. Thus, the time delay ΔT can be controlled by controlling the preset current and/or the specified amount of the voltage change. For instance, the time delay ΔT can be decreased by increasing the preset current or by reducing the specified amount of voltage change.

In an embodiment, if the fast-test detection circuit 432 receives, at the switching terminal VCC, a second protection signal $S_{OV2}$ from the output terminal OV of the second protection module 312, then the fast-test detection circuit 432 controls the delay circuit 428 to change the predetermined time delay ΔT from the first time interval ΔTN to the second time interval ΔTF. For example, the fast-test detection circuit 432 includes a comparator 432. The comparator 432 can compare a voltage difference between the switching terminal VCC and the first monitoring terminal BAT5 with a threshold voltage $V_{TH}$, and can generate a result signal TEST_MD to control the delay circuit 428 based on the comparison. In an embodiment, a voltage level of the second protection signal $S_{OV2}$ is high enough to cause a voltage drop across the resistor $R_{FT}$, e.g., representing the voltage difference between the terminals VCC and BAT5, to be greater than the threshold voltage $V_{TH}$.

As a result, in the example of FIG. 4, if an abnormal condition such as an over-voltage condition in the first set of battery cells 304 is detected, e.g., via the terminals VSS, BAT1, BAT2, and BAT3, then the delay circuit 428 outputs a protection signal 434, with a delay of the first time interval ΔTN, to protect the battery cells 304. If an abnormal condition such as an over-voltage condition in the second set of battery cells 314 is detected, e.g., via the terminals BAT4 and BAT5, then the delay circuit 428 outputs a protection signal 434, with a delay of the second time interval ΔTF, to protect the battery cells 314. The time delay from when the second protection module 312 detects a sign of abnormal condition in the second set of battery cells 314 to when the first protection module 302 outputs the protection signal 434 can be approximately equal to ΔTN+ΔTF.

Figure 5A:
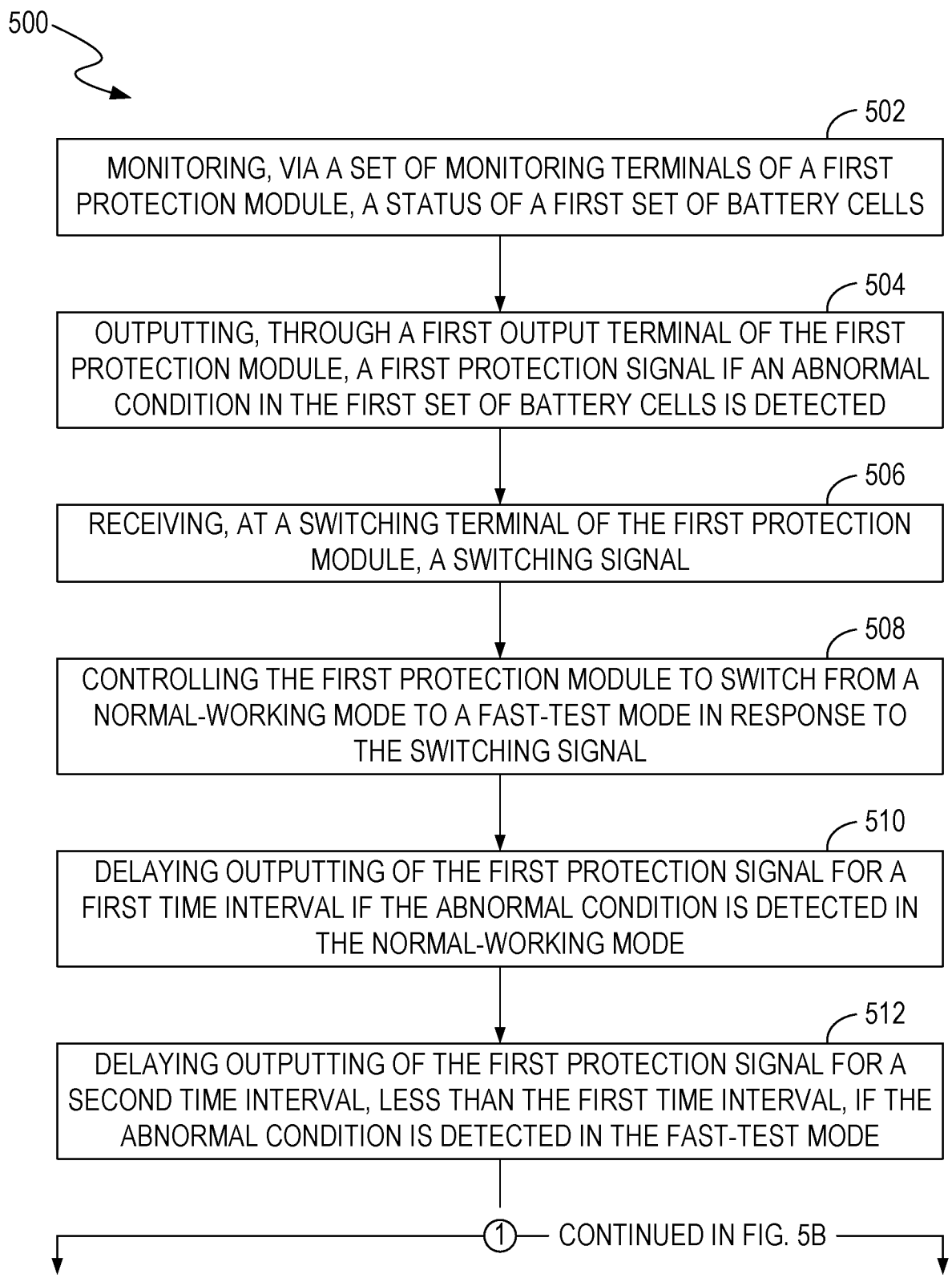
FIG. 5A and FIG. 5B illustrate a flowchart of examples of operations performed by a battery protection system, in an embodiment of the present invention.
Figure 5B:
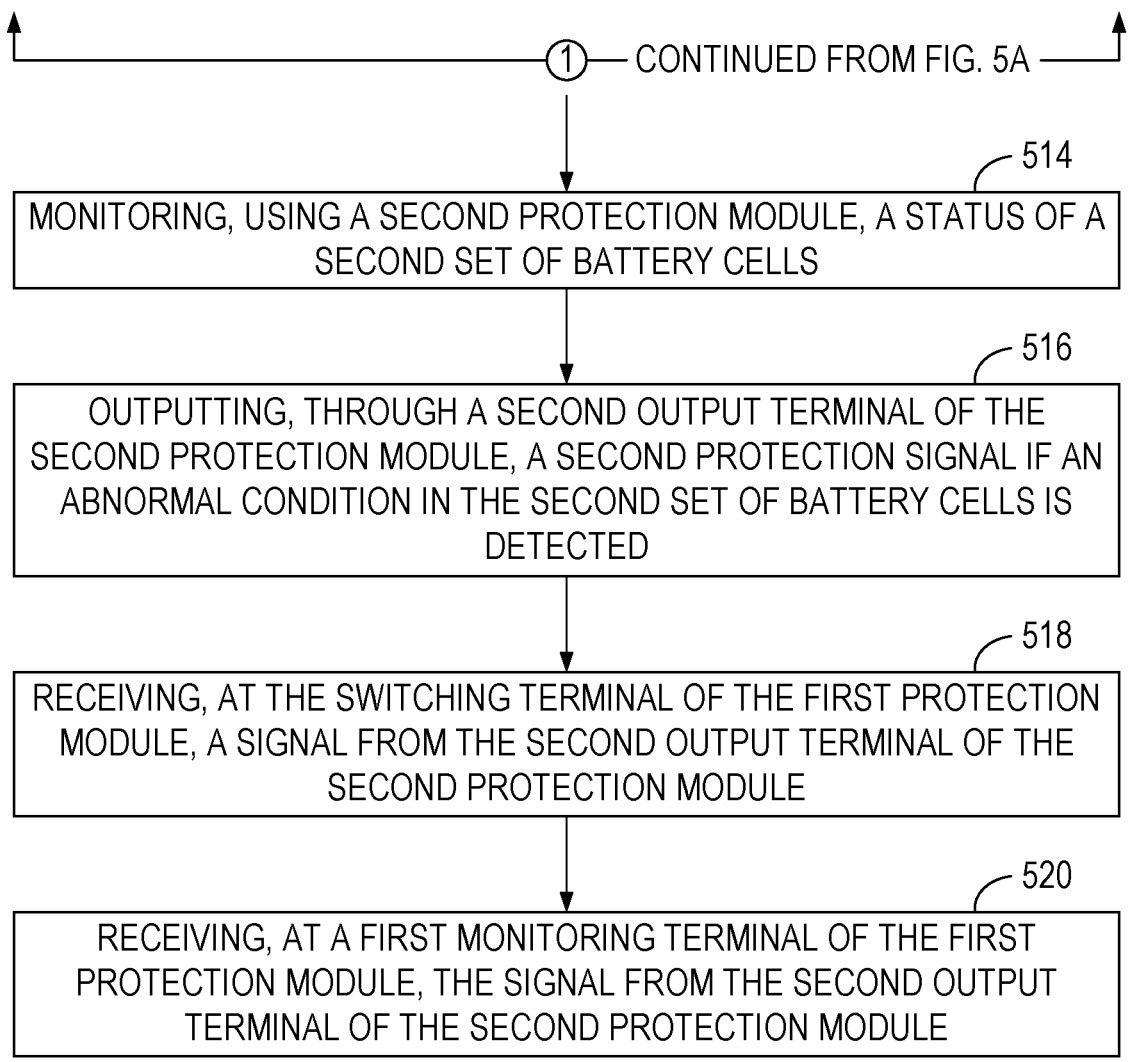

FIG. 5A and FIG. 5B illustrate a flowchart of examples of operations performed by a battery protection system 300, in an embodiment of the present invention. FIG. 5A and FIG. 5B are described in combination with FIG. 3 and FIG. 4. Although specific steps are disclosed in FIG. 5A and FIG. 5B, such steps are examples for illustrative purposes. That is, embodiments according to the present invention are well suited to performing various other steps or variations of the steps recited in FIG. 5A and FIG. 5B.

At step 502, a first protection module 302 monitors a status of a first set of battery cells 304 via a set of monitoring terminals. For example, the first protection module 302 monitors cell voltages of the battery cells 304 and determines whether a cell voltage of a battery cell of the battery cells 304 is greater than a reference voltage. If a cell voltage of the battery cells 304 is greater than a reference voltage, then the first protection module 302 starts to count time. When a predetermined time interval expires, if the cell voltage of the battery cells 304 is still greater than the reference voltage, then the first protection module 302 determines that an abnormal condition, e.g., an over-voltage condition, is present in the battery cells 304.

At step 504, the first protection module 302 outputs, via its first output terminal OV, a first protection signal $S_{OV1}$ if an abnormal condition, e.g., an over-voltage condition, in the battery cells 304 is detected. In embodiments, the first protection signal is delayed (e.g., see steps 512 and 514).

At step 506, the first protection module 302 receives, at its switching terminal VCC, a switching signal, e.g., $S_{OV2}$.

At step 508, the first protection module 302 switches from a normal-working mode to a fast-test mode in response the switching signal, e.g., $S_{OV2}$.

At step 510, the first protection module 302 delays outputting the first protection signal $S_{OV1}$ for a first time interval ΔTN (e.g., one, two, or four seconds) if the abnormal condition is detected while the first protection module 302 is in the normal-working mode.

At step 512, the first protection module 302 delays outputting the first protection signal $S_{OV1}$ for a second time interval ΔTF (e.g., sixteen or thirty-two milliseconds), less than the first time interval ΔTN, if the abnormal condition is detected while the first protection module 302 is in the fast-test mode.

At step 514, a second protection module 312 monitors a status of a second set of battery cells 314. For example, the second protection module 312 monitors cell voltages of the battery cells 314 and determines whether a cell voltage of a battery cell of the battery cells 314 is greater than a reference voltage. If a cell voltage of the battery cells 314 is greater than a reference voltage, then the second protection module 312 starts to count time. When a predetermined time interval expires, if the cell voltage of the battery cells 314 is still greater than the reference voltage, then the second protection module 312 determines that an abnormal condition, e.g., an over-voltage condition, is present in the battery cells 314.

At step 516, the second protection module 312 outputs, via its second output terminal OV, a second protection signal $S_{OV2}$ if an abnormal condition, e.g., an over-voltage condition, in the battery cells 314 is detected.

At step 518, the first protection module 302 receives, at its switching terminal VCC, a signal, e.g., $S_{OV2}$, from the second output terminal OV of the second protection module 312.

At step 520, the first protection module 302 also receives, at its first monitoring terminal BAT5, the signal, e.g., $S_{OV2}$, from the second output terminal OV of the second protection module 312.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

I claim:

1. A battery protection system comprising:
a plurality of protection modules, each protection module of said protection modules comprising:
a plurality of monitoring terminals operable for monitoring a status of a plurality of battery cells;
an output terminal operable for outputting a protection signal if an abnormal condition in said battery cells is detected;
a switching terminal operable for receiving a switching signal; and
detection circuitry, coupled to said monitoring terminals, said output terminal, and said switching terminal, and configured to: switch from a normal-working mode to a fast-test mode in response to said switching signal, delay said outputting of said protection signal for a first time interval if said abnormal condition is detected in said normal-working mode, and delay said outputting of said protection signal for a second time interval, less than said first time interval, if said abnormal condition is detected in said fast-test mode,
wherein said protection modules comprise a first protection module and a second protection module, and wherein the switching terminal of said first protection module and a first monitoring terminal of said first protection module are coupled to said second protection module and are operable for receiving the protection signal output from the output terminal of said second protection module.

2. The battery protection system of claim 1, further comprising a fuse, coupled to said plurality of battery cells, and configured to be controlled by a first protection signal output from the output terminal of said first protection module.

3. The battery protection system of claim 2, wherein said first protection module is configured to monitor status of a first plurality of battery cells, and said second protection module is configured to monitor status of a second plurality of battery cells, and wherein if an abnormal condition in said second plurality of battery cells is detected, then: said second protection module is configured to output a second protection signal to said first monitoring terminal of said first protection module, and said output terminal of said first protection module is configured to output said first protection signal to burn said fuse.

4. The battery protection system of claim 1, wherein said abnormal condition comprises an over-voltage condition.

5. The battery protection system of claim 1, wherein if said switching terminal of said first protection module receives a protection signal from said output terminal of said second protection module, then the detection circuitry of said first protection module is configured to switch from said normal-working mode to said fast-test mode.

6. The battery protection system of claim 1, wherein the detection circuitry of said first protection module comprises:
a monitoring circuit, coupled to said monitoring terminals of said first protection module, and configured to monitor a status of a plurality of cell voltages, and also configured to generate an indication signal if a cell voltage of said cell voltages is greater than a reference voltage;
a delay circuit, coupled to said monitoring circuit, and configured to start to count time in response to said indication signal, and also configured to generate a first protection signal with a predetermined time delay; and
a fast-test detection circuit, coupled to said delay circuit, and configured to control said delay circuit to change said predetermined time delay from said first time interval to said second time interval if said fast-test detection circuit receives, at the switching terminal of said first protection module, a second protection signal from said output terminal of said second protection module.

7. The battery protection system of claim 6, wherein said plurality of cell voltages comprises cell voltages of a first plurality of battery cells coupled to said first protection module and cell voltages of a second plurality of battery cells coupled to said second protection module, and wherein a signal at said first monitoring terminal of said first protection module is configured to be controlled according to a status of said cell voltages of said second plurality of battery cells.

8. The battery protection system of claim 6, wherein said fast-test detection circuit comprises a comparator configured to: compare a voltage difference between said switching terminal of said first protection module and said first monitoring terminal of said first protection module with a threshold voltage and generate a result signal to control said delay circuit according to the comparison.

9. A battery pack comprising:
a first plurality of battery cells;
a second plurality of battery cells coupled to said first plurality of battery cells;
a first protection module coupled to said first plurality of battery cells; and
a second protection module coupled to said second plurality of battery cells,
wherein each protection module of said first and second protection modules comprises:
a plurality of monitoring terminals operable for monitoring a status of a corresponding plurality of battery cells of said first and second pluralities of battery cells;
an output terminal operable for outputting a protection signal if an abnormal condition in said corresponding plurality of battery cells is detected;
a switching terminal operable for receiving a switching signal; and
detection circuitry, coupled to said monitoring terminals, said output terminal, and said switching terminal, and configured to: switch from a normal-working mode to a fast-test mode in response to said switching signal, delay said outputting of said protection signal for a first time interval if said abnormal condition is detected in said normal-working mode, and delay said outputting of said protection signal for a second time interval, less than said first time interval, if said abnormal condition is detected in said fast-test mode,
and wherein the switching terminal of said first protection module and a first monitoring terminal of said first protection module are coupled to said second protection module and are operable for receiving the protection signal output from the output terminal of said second protection module.

10. The battery pack of claim 9, further comprising a fuse, coupled to said first and second pluralities of battery cells, and configured to be controlled by a first protection signal output from the output terminal of said first protection module.

11. The battery pack of claim 10, wherein said first protection module is configured to monitor a status of said first plurality of battery cells, and said second protection module is configured to monitor a status of said second plurality of battery cells, and wherein if an abnormal condition in said second plurality of battery cells is detected, then: said second protection module is configured to output a second protection signal to said first monitoring terminal of said first protection module, and said output terminal of said first protection module is configured to output said first protection signal to burn said fuse.

12. The battery pack of claim 9, wherein said abnormal condition comprises an over-voltage condition.

13. The battery pack of claim 9, wherein if said switching terminal of said first protection module receives a protection signal from said output terminal of said second protection module, then the detection circuitry of said first protection module is configured to switch from said normal-working mode to said fast-test mode.

14. The battery pack of claim 9, wherein the detection circuitry of said first protection module comprises:
a monitoring circuit, coupled to said monitoring terminals of said first protection module, and configured to monitor a status of a plurality of cell voltages, and also configured to generate an indication signal if a cell voltage of said cell voltages is greater than a reference voltage;
a delay circuit, coupled to said monitoring circuit, and configured to start to count time in response to said indication signal, and also configured to generate a first protection signal after a predetermined time delay; and
a fast-test detection circuit, coupled to said delay circuit, and configured to control said delay circuit to change said predetermined time delay from said first time interval to said second time interval if said fast-test detection circuit receives, at the switching terminal of said first protection module, a second protection signal from said output terminal of said second protection module.

15. The battery pack of claim 14, wherein said plurality of cell voltages comprises cell voltages of said first plurality of battery cells and cell voltages of said second plurality of battery, and wherein a signal at said first monitoring terminal is configured to be controlled according to a status of said cell voltages of said second plurality of battery cells.

16. The battery pack of claim 14, wherein said fast-test detection circuit comprises a comparator configured to: compare a voltage difference between said switching terminal of said first protection module and said first monitoring terminal of said first protection module with a threshold voltage, and generate a result signal to control said delay circuit according to the comparison.

17. A method for protecting a battery pack comprising a first plurality of battery cells and a second plurality of battery cells, said method comprising:
monitoring, via a plurality of monitoring terminals of a first protection module, a status of said first plurality of battery cells;
receiving, at a switching terminal of said first protection module, a switching signal;
controlling said first protection module to switch from a normal-working mode to a fast-test mode in response to said switching signal;
outputting, through a first output terminal of said first protection module, a first protection signal if an abnormal condition in said first plurality of battery cells is detected, wherein said outputting of said first protection signal is delayed for a first time interval if said abnormal condition is detected in said normal-working mode, and wherein said outputting of said first protection signal is delayed for a second time interval, less than said first time interval, if said abnormal condition is detected in said fast-test mode;
monitoring, using a second protection module, a status of said second plurality of battery cells; and
outputting, through a second output terminal of said second protection module, a second protection signal if an abnormal condition in said second plurality of battery cells is detected,
wherein said method further comprises:
receiving, at said switching terminal of said first protection module, said second protection signal from said second output terminal of said second protection module; and
receiving, at a first monitoring terminal of said first protection module, said second protection signal from said second output terminal of said second protection module.

18. The method of claim 17, further comprising:
controlling a fuse, coupled to said first and second pluralities of battery cells, using said first protection signal.

19. The method of claim 17, further comprising:
monitoring status of a plurality of cell voltages using a monitoring circuit in said first protection module;
generating an indication signal if a cell voltage of said cell voltages is greater than a reference voltage;
starting to count time in response to said indication signal;
generating, using a delay circuit in said first protection module, said first protection signal after a predetermined time delay; and
changing said predetermined time delay from said first time interval to said second time interval if said second protection signal is received at said switching terminal of said first protection module.

20. The method of claim 19, further comprising:
comparing a voltage difference between said switching terminal of said first protection module and said first monitoring terminal of said first protection module with a threshold voltage; and
controlling said delay circuit according to a result of said comparing.

* * * * *